United States Patent [19]

Yoshioka et al.

[11] Patent Number: 4,865,952

[45] Date of Patent: Sep. 12, 1989

[54] METHOD OF FORMING A T-SHAPED CONTROL ELECTRODE THROUGH AN X-RAY MASK

[75] Inventors: Nobuyuki Yoshioka; Noriaki Ishio, both of Hyogo, Japan

[73] Assignee: Mitsubishi Denki Kabushiki Kaisha, Tokyo, Japan

[21] Appl. No.: 99,000

[22] Filed: Sep. 21, 1987

[30] Foreign Application Priority Data

Sep. 20, 1986 [JP] Japan ................................. 61-223369
Sep. 20, 1986 [JP] Japan ................................. 61-223370

[51] Int. Cl.$^4$ ............................................... G03C 5/16
[52] U.S. Cl. ..................................... 430/315; 430/326; 430/967; 437/176; 437/229; 378/35
[58] Field of Search ............... 430/313, 315, 394, 966, 430/967; 437/176, 203, 229; 378/34, 35

[56] References Cited

U.S. PATENT DOCUMENTS

| 4,035,522 | 7/1977 | Hatzakis | 430/966 X |
| 4,341,850 | 7/1982 | Coane | 430/11 |
| 4,394,437 | 7/1983 | Bergendahl et al. | 430/312 |
| 4,536,942 | 8/1985 | Chao et al. | 437/177 |

FOREIGN PATENT DOCUMENTS

| 31135 | 2/1982 | Japan . | |
| 135468 | 8/1984 | Japan | 430/5 |

OTHER PUBLICATIONS

Feder et al, IBM TDB, vol. 17 (8), Jan. 1975, pp. 2460–2461.
Feder et al, IBM TDB, vol. 18(9), Feb. 1976, pp. 3129–3131.
Y. Todokoro, "Double Layer Resist Films for Submicrometer Electron Beam Lithography", *IEEE*, vol. ED-27, No. 8, pp. 1443–1448.
Y. Todokoro et al, "Formation of a T-Shaped Gate Through Electron Beam Exposure", *Japanese Society of Applied Physics*, 1979, 2P-A-4.
H. Matsumora et al, "Submicrometer Lift-Off Line with T-Shaped Cross Sectional Form", *Electronics Letters*, vol. 17, No. 12, pp. 429–430.
Muller et al, "Synchrotron Lithography for Sub-Half-Micron T-Gates in GaAs-FETS", 1986, *Microcircuit Engineering*.
Takahashi et al, "A Half-Micron Gate GaAs FET Fabricated by Chemical Dry Etching", 1977, *Japanese Journal of Applied Physics*, vol. 16, Supplement 16-1, pp. 115–118.

Primary Examiner—Jose G. Dees
Attorney, Agent, or Firm—Lowe, Price, Leblanc, Becker & Shur

[57] ABSTRACT

A positive resist film is formed on the major surface of a semiconductor substrate, to be irradiated with X-rays through an X-ray mask. The X-ray mask is formed by a joined member of an X-ray transmittable substrate and an X-ray absorber, and the X-ray absorber has an opening section of a T shape, in order to change the amount of transmission of the X-rays in desired positions. After the irradiation with the X-rays, the positive resist film is developed to obtain a resist film having an opening section of a desired T shape. A film for providing a control electrode is formed in the opening section of the resist film and the resist film is removed, thereby to form a T-shaped control electrode on the semiconductor substrate.

12 Claims, 13 Drawing Sheets

METHOD OF FORMING A T-SHAPED CONTROL ELECTRODE THROUGH AN X-RAY MASK

BACKGROUND OF THE INVENTION

1. Field of the Invention

The present invention relates to a semiconductor device and, more particularly, it relates to a method and an apparatus for manufacturing a T-shaped control electrode for a field effect semiconductor device.

2. Description of the Prior Art

As semiconductor technology has matured, it has become necessary to speed up the operating functions of a semiconductor device. In a semiconductor device operating at a very high speed, it is necessary to employ an element structure such that the distance of electron movement in the semiconductor material is as short as possible. A typical example of such a semiconductor device is a field effect semiconductor device employing a T-shaped control electrode.

A conventional method of forming such a T-shaped control electrode is described with reference to FIGS. 1A to 1E.

As shown in FIG. 1A, a low-sensitivity positive resist film 2 of about 0.2 μm in thickness is formed on a substrate 1 and a high-sensitivity positive resist film 3 of about 0.5 μm in thickness is formed on the low-sensitivity positive resist film 2. The double-layer resist films 2 and 3 are treated by the same developing solution.

Then, electron beams 4 are applied to desired positions as shown in FIG. 1B, to expose the high-sensitivity positive resist film 3 and the low-sensitivity positive resist film 2.

After the exposure, the films 2 and 3 are subjected to development. While the upper high-sensitivity positive resist film 3 is readily soluble in the developing solution, the lower low-sensitivity positive resist film 2 is not easily dissolved as compared with the high-sensitivity positive resist film 3 with respect to the same exposure of electron beams. Thus, a resist pattern of the configuration as shown in FIG. 1C is formed by openings 5 and 6 through such difference in solubility.

Then the entire substance including the resist pattern portion is subjected to vacuum evaporation, thereby to form a control electrode film 7 of about 0.6 μm in thickness as shown in FIG. 1D.

Finally, the entire substance is dipped in a solution which can dissolve the high-sensitivity positive resist film 3 and the low-sensitivity positive resist film 2 to also remove the control electrode film 7 located on the high-sensitivity positive resist film 3, thereby to obtain a T-shaped control electrode 8 as shown in FIG. 1E.

Methods of forming such T-shaped control electrodes through double-layer positive resist films of different sensitivity are disclosed in "Double-Layer Resist Films for Submicrometer Electron-Beam Lithography" (Y. Todokoro), 1980, IEEE Vol. ED-27, No. 8, pp. 1443–1448; "Formation of a T-Shaped Gate through Electron Beam Exposure" (Y. Todokoro et al.), Japan Society of Applied Physics, 1979 (Autumn), 2P-A-4; "Submicrometre Lift-Off Line with T-shaped Cross-Sectional Form" (H. Matsumura et al.), 1981 Electronics Letters, Vol. 17, No. 12, pp. 429–430; and "Method of Forming a T-shaped Gate Pattern" (Y. Yamashita), Japan Society of Applied Physics, 1984 (Autumn).

However, although the conventional method of forming a T-shaped contorl electrode required two types of resist films of different sensitivity which are treated by the same developing solution, a mixing action may take place in a boundary portion between the resist films since the components of the resist films are substantially identical to each other. The difference in sensitivity is indistinct in the vicinity of the boundary portion, and hence it is difficult to form an accurate resist pattern, i.e., a T-shaped control electrode of high accuracy after development.

Further, irradiation of electron beams must be executed in sequence per desired pattern through electron beam exposure technique, whereby the throughput is reduced.

"Synchrotron Lithography for Sub-Half-Micron T-Gates in GaAs-FETs" (K. H. Muller et al.), in the 1986 "Microcircuit Engineering" discloses a method of laminating three resist films of different sensitivity and exposing the same by X-rays thereby to form a T-shaped control electrode as a resist pattern of a desired sectional configuration.

"A Half-Micron Gate GaAs FET Fabricated by Chemical Dry Etching" (S. Takahashi et al.) in the Japanese Journal of Applied Physics, 1977, Vol. 16, Supplement 16-1, pp. 115–118 discloses a method of forming two layers of dissimilar metal films on a semiconductor substrate thereby to form a T-shaped control electrode through exposure and chemical etching.

Further, Japanese Patent Laying-Open Gazette No. 31135/1982, entitled "Method of Batch Formation of a Metal Pattern" (A. Ozawa et al.), discloses a method of batch formation of a metal pattern having different two stages for serving as an absorber of an X-ray mask comprising an absorber having double contrast.

In this method, a structure film formed by laminating two types of resist films of different sensitivity is exposed to form a resist pattern having two different stages. This resist pattern is employed to transfer the pattern to an intermediate film on a substrate provided under the same, thereby to form a desired metal pattern on the substrate by employing the intermediate film as a model.

However, none of the aforementioned prior art examles provides the advantages of the method this invention for forming a T-shaped control electrode of high accuracy and high throughput. Further, the conventional method of forming an X-ray mask having double contrast requires a laminated resist film and an intermediate film and includes a complicated step of transferring a pattern from a resist pattern to the intermediate film, and hence this method is leads to a more difficult process.

SUMMARY OF THE INVENTION

A principal object of the present invention is to provide a method of forming a T-shaped control electrode of high productivity on the major surface of a semiconductor substrate in high accuracy.

In a preferred embodiment of the present invention, the method of forming a T-shaped control electrode comprises the steps of; preparing a semiconductor substrate having a major surface; forming a positive resist film on the major surface of the semiconductor substrate; irradiating the positive resist film with X-rays through an X-ray mask to form a first irradiated region corresponding to lower width of a T shape and obtaining first exposure and a second irradiating region corresponding to upper width of the T shape and obtaining second exposure on the positive resist film; developing the positive resist film irradiated with X-rays to remove parts of the first and second irradiated regions, thereby to obtain a resist film having a sectional configuration corresponding to the T shape; forming a film for providing a control electrode in a portion of the resist film having the sectional configuration; and removing the resist film.

According to the method of forming a T-shaped control electrode baesd on the above described steps, X-ray exposure is varied with positions corresponding to the T shape, whereby no double-layer resist film of different sensitivity is required but a resist film having a desired sectional configuration can be reliably obtained from a single-layer positive resist film in high accuracy through development, since depth of development of such a positive resist film is determined on the basis of the X-ray exposure.

In another aspect of the present invention, the method of forming a T-shaped control electrode comprises the a step of: preparing a semiconductor substrate having a major surface; forming a positive resist film on the major surface of the semiconductor substrate; irradiating the positive resist film with X-rays through an X-ray mask which is formed by a joined member of a substrate for transmitting X-rays and an absorber for absorbing X-rays, which absorber has an opening section being in contact with the substrate and corresponding to a T shape so that the amount of transmission of the X-rays is changed in a desired position; developing the positive resist film irradiated with X-rays to obtain a resist film having a desired sectional configuration; forming a film for providing a control electrode on a portion of the resist film having the said sectional configuration; and removing the resist film.

According to the method of forming a T-shaped control electrode baesd on the above described steps, the amount of the X-rays transmitted through the X-ray mask is changed in a prescribed position so that exposure of the X-rays applied to the positive resist film is changed in desired positions. Thus, the exposure of the X-rays is controlled by the X-ray mask so that a resist film having a desired sectional configuration can be obtained by batch irradiation of the X-rays, thereby to greatly improve productivity of the process.

In still another aspect of the present invention, the method of forming a T-shaped control electrode comprises the steps of: preparing a semiconductor substrate having a major surface; forming a positive resist film on the major surface of the semiconductor substrate; irradiating the positive resist film with divergent X-rays through an X-ray mask provided at a first distance from the semiconductor substrate; irradiating the positive resist film with the X-rays through the X-ray mask provided at a second distance, which is different from the first distance, from the semiconductor substrate; developing the positive resist film irradiated with the X-rays to obtain a resist film having a desired sectional configuration responsive to X-ray exposure; forming a film for providing a control electrode on a portion of the resist film having the said sectional configuration; and removing the resist film.

According to the method of forming a T-shaped control electrode based on the above described steps, the divergent X-rays are irradiated twice while changing the distance between the X-ray mask and the semiconductor substrate, so that exposure is changed in desired positions of the positive resist film due to the difference in exposure area. Thus, the X-ray exposure is controlled by locations of the X-ray mask, whereby a resist film having a desired sectional configuration can be reliably obtained without preparing a specific X-ray mask.

The X-ray mask employed for the inventive method of forming a T-shaped control electrode has a substrate for transmitting X-rays and an absorber formed on the substrate for absorbing X-rays, and the absorber has an opening section being in contact with the substrate and corresponding to a T-shaped sectional configuration of the T-shaped control electrode.

In the X-ray mask thus formed, the section of the absorber is irregularized in thickness, thereby to control the amount of transmission of the X-rays in response to its sectional configuration.

In another aspect of the present invention, a method of manufacturing an X-ray mask for forming a T-shaped control electrode the steps of preparing a substrate which transmits X-rays; a step of forming a first absorber not transmitting X-rays on the substrate; forming a first resin film corresponding to lower width of a T shape on the first absorber; forming a second absorber not transmitting X-rays on the first absorber by utilizing the resin film as a model; forming a second resin film corresponding to upper width of the T shape on the first resin film and parts of the second absorber; forming a third absorber not tranmitting X-rays on the second absorber by utilizing the second resin film as a model; and removing the first and second resin films.

According to the method of manufacturing an X-ray mask based on the above described steps, the first and second resin films corresponding to the lower width and the upper width of the T shape are so provided as to form the absorbers on the substrate by utilizing the resin films as models, whereby an X-ray mask having an absorber of accurate sectional configuration can be obtained.

In another aspect of the present invention, the inventive method of manufacturing an X-ray mask for forming a T-shaped control electrode comprises the steps of: preparing a substrate which transmits X-rays; forming a first absorber not transmitting X-rays on the substrate; forming a first resin film on the first absorber; forming a first metal film on the first resin film; forming a first electron beam resist film on the first metal film; exposing the first electron beam resist film by electron beam exposure technique to form a first resist pattern corresponding to lower width of a T shape; removing the exposed portion of the first metal film by utilizing the first resist pattern as a mask; removing the first resist pattern and the exposed portion of the first resin film by utilizing the residual portion of the first metal film as a mask; removing the residual portion of the first metal film; forming a second absorber not transmitting X-rays on the first absorber by utilizing the residual portion of the first resin film as a model; forming a second resin film on the second absorber including the residual part of the first resin film; forming a second metal film on the second resin film; forming a second electron beam resist film on the second metal film; exposing the second electron beam resist film by electron beam exposure technique to form a second resist pattern corresponding to upper width of the T shape; removing the exposed portion of the second metal film by utilziing the second resist pattern as a mask; removing the second resist pattern and the exposed portion of the second resin film by utilizing the residual portion of the second metal film as a mask; removing the residual portion of the second metal film; forming a third absorber not transmitting X-rays on the second absorber by utilizing the residual portion of the second resin film as a model; and removing the residual portions of the first and second resin films.

According to the method of manufacturing an X-ray mask based on the above described steps, the first and second resin films corresponding to the lower width and upper width of the T shape are formed on the basis of the resist film obtained through exposure technique. Thus, horizontal positional relation between the first and second resin films is correctly maintained so that an X-ray mask having an absorber of a highly accurate sectional configuration can be obtained as the result.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
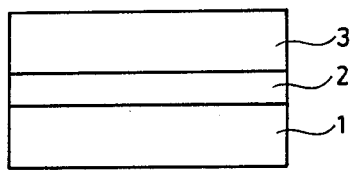
FIGS. 1A to 1E are sectional views showing principal steps in a conventional method of forming a T-shaped control electrode on a semiconductor substrate.
Figure 1B:
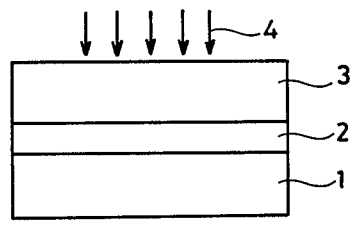
Figure 1C:
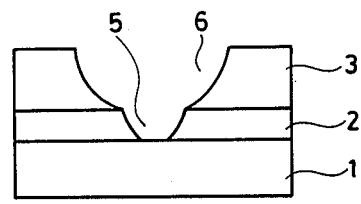
Figure 1D:
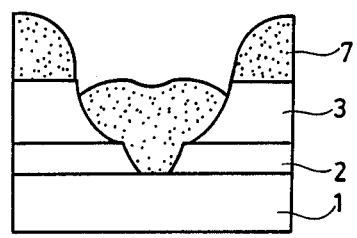
Figure 1E:
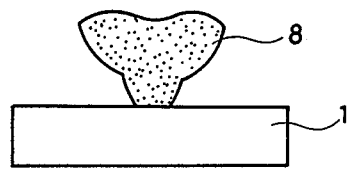
Figure 2:
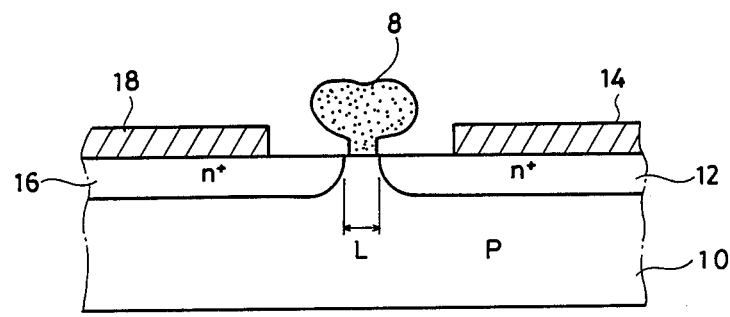
FIG. 2 is a schematic sectional view showing a field effect transistor having a T-shaped control electrode to which the present invention is applied.

FIG. 2 is a schematic sectional view showing a field effect transistor having a T-shaped control electrode, to which the present invention is applied.

Referring to FIG. 2, a description is now provided of the structure of this transistor. A source region 12 and a drain region 16 are formed as $n^+$-type impurity regions on the major surface of a p-type semiconductor substrate 10. A source electrode 14 and a drain electrode 18 are formed on the source region 12 and the drain region 16 respectively, while a control electrode 8 is formed on the major surface of the semiconductor substrate 10 in a portion held between the source region 12 and the drain region 16.

The field effect transistor of the aforementioned structure is similar in operation to a conventional field effect transistor, while contact width (L) between the T-shaped control electrode 8 and the semiconductor substrate 10 can be reduced as compared with a control electrode of a rectangular configuration without decreasing its sectional area since the T-shaped control electrode 8 has a T-shaped section. In other words, the gate length of the T-shaped control electrode 8 can be reduced without increasing its resistance value. Thus, such a field effect transistor can operate at a very high speed, and internal noise is reduced by an effect of gain improvement.

Figure 3:
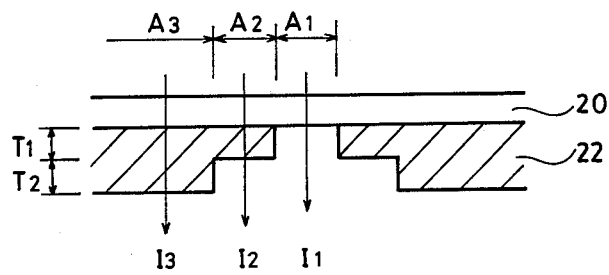
FIG. 3 is a sectional view showing an X-ray mask according to the embodiment of the present invention, which X-ray mask is provided with an X-ray absorber having a T-shaped opening section formed on a substrate.

FIG. 3 is a sectional view of an X-ray mask employed in an embodiment of a method of forming such a T-shaped control electrode.

Referring to FIG. 3, an X-ray transmittable substrate 20 of silicon nitride (SiN) or the like is provided with an X-ray absorber 22 of gold (Au) or the like having a T-shaped opening section.

Figure 4:
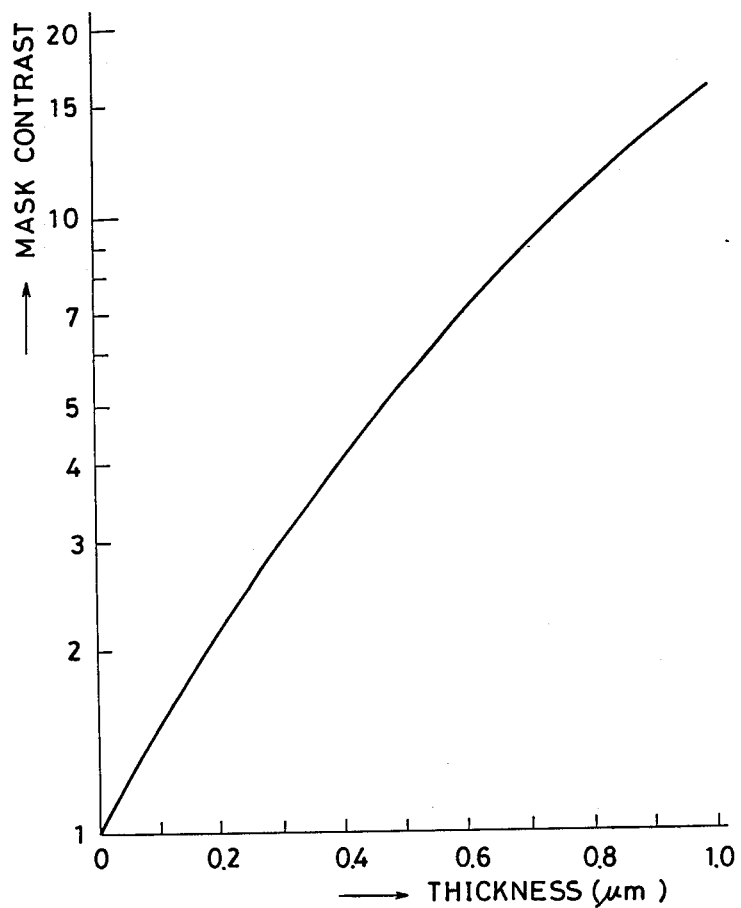
FIG. 4 illustrates the relationship between thickness of the X-ray absorber in the X-ray mask according to the embodiment of the present invention and mask contrast based on X-rays, with the horizontal axis showing the thickness and the vertical axis showing the mask contrast.

FIG. 4 illustrates relation between a thickness of the X-ray transmittable substrate 20 and mask contrast based on X-rays (PdLα rays).

Referring to FIG. 4, the horizontal axis shows the thickness of an Au film serving as the X-ray absorber and the vertical axis shows the mask contrast. The mask contrast is the ratio of intensity of X-rays passing through the X-ray transmittable substrate alone to that of X-rays passing through X-ray transmittable substrate and the Au film. As is obvious from FIG. 4, the mask contrast by the X-rays is generally small such that the value thereof is 15 with respect to the Au film thickness of 1.0 μm and 4 with respect to the Au film thickness of 0.4 μm. Namely, in case of performing X-ray exposure on a resist film by employing the Au film of 0.4 μm in thickness as a mask, the X-ray exposure under the Au film is ¼ when the exposure of the X-rays passing through the substrate alone to the resist film is 1.

With reference to FIGS. 3 and 4, the function of an X-ray mask for forming the T-shaped control electrode according to the present invention is now described.

Referring to FIG. 3, symbol $A_1$ indicates a pattern of only the X-ray transmittable substrate 20, the width of which corresponds to the width of a lower part of the T-shaped control electrode, and symbol $A_2$ indicates a portion provided with the X-ray absorber 22 of thickness $T_1$ such that width $(A_1 + 2 \times A_2)$ corresponds to width of an upper part of the T-shaped control electrode, while symbol $A_3$ indicates a portion provided with the X-ray absorber 22 of thickness $T_1 + T_2$. Assuming that symbols $I_1$, $I_2$ and $I_3$ represent intensity levels of the X-rays transmitted through the portions $A_1$, $A_2$ and A3 respectively while $T_1=0.2$ μm and $T_2=0.8$ μm, the following expressions hold for the relation between the mask contrast and the Au film thickness as shown in FIG. 4:

$$I_1/I_2=2, I_1/I_3=15$$

Thus, it is obvious that an X-ray intensity, i.e., X-ray exposure responsive to the thickness of the X-ray absorber is obtained.

The method of manufacturing the X-ray mask for forming a T-shaped control electrode according to the present invention is described below.

FIGS. 5A to 5I are sectional views showing principal steps of the method of manufacturing an X-ray mask according to a preferred embodiment of the present invention.

Figure 5A:
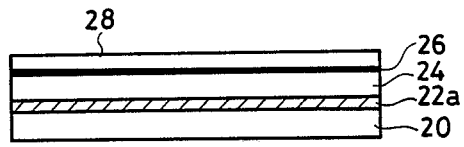
FIGS. 5A to 5I are sectional views showing principal steps on the method of manufacturing an X-ray mask provided on a substrate according to a preferred embodiment of the present invention.

As shown in FIG. 5A, an X-ray absorber 22a of an Au film or the like, for example, as an Au-plated electrode, is formed in thickness of about 500 Å on an X-ray transmittable substrate 20 of, e.g., SiN, and a three-layer resist film formed by a lower polyimide layer 24 of 0.5 μm thickness, an intermediate molybdenum layer 26 of 0.1 μm thickness and an upper electron beam resist layer 28 0.3 μm in thickness is provided on the X-ray absorber 22a.

Figure 5B:
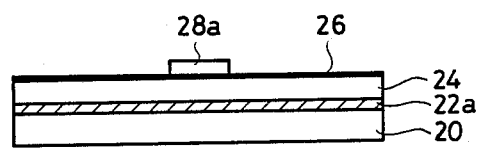

Then the electron beam resist film 28 is exposed through electron beam exposure technique in a desired width corresponding to the lower width of a T-shaped control electrode, to obtain the pattern of a desired electron beam resist film 28a as shown in FIG. 5B.

Figure 5C:
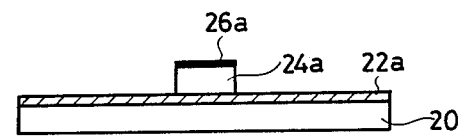

Exposed portions of the molybdenum layer 26 and the polyimide layer 24 are then through reactive ion etching (RIE) by utilizing the pattern of the electron beam resist film 28a as a mask and, thereafter the residual electron beam resist film 28a is removed as illustrated in FIG. 5C.

Figure 5D:
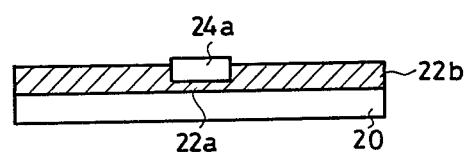

A residual molybdenum layer portion 26a is removed and a residual polyimide layer portion 24a is utilized as a model for plating to perform electrolytic plating of an X-ray absorber of Au, etc., thereby to form an X-ray absorber 22b of about 0.2 μm thickness as illustrated in FIG. 5D.

Figure 5E:
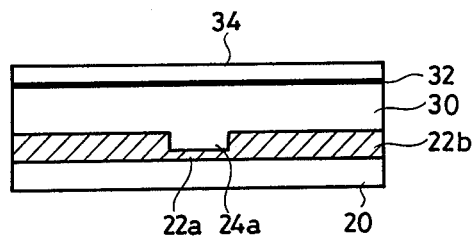

Then, similarly to the step as shown in FIG. 5A, a three-layer resist film formed by a polyimide film 30 of 1.0 μm thickness, a molybdenum film 32 of 0.3 μm thickness and an electron beam resist film 34 of 0.3 μm thickness is provided on the X-ray absorber 22b and the polyimide layer portion 24a as shown in FIG. 5E.

Figure 5F:
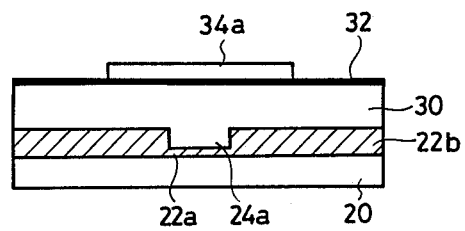

The electron beam resist film 34 is exposed in desired width corresponding to upper width of the T-shaped control electrode through an electron beam exposure technique similar to the than in the step illustrated in FIG. 5B, to obtain the pattern of a desired electron beam resist film 34a as shown in FIG. 5F.

Figure 5G:
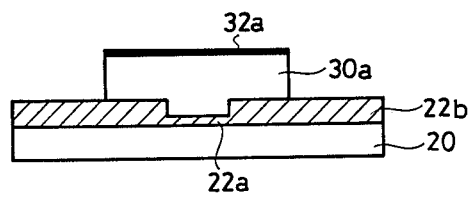

Similarly to the step as shown in FIG. 5C, the pattern of the electron beam resist film 34a is utilized as a mask to remove exposed portions of the molybdenum film 32 and the polyimide film 30 respectively through reactive ion etching (RIE) and, thereafter, a residual electron beam resist portion 34a is removed as shown in FIG. 5G.

Figure 5H:
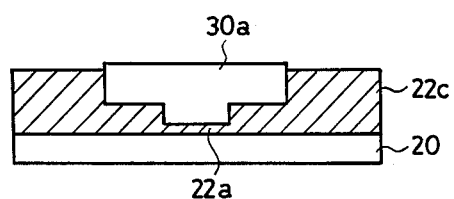

A residual molybdenum portion 32a is then removed and thereafter a residual polyimide portion 30a is utilized as a model for plating as shown in FIG. 5H to perform electrolytic plating of an X-ray absorber of Au or the like, thereby to obtain an X-ray absorber 22c of about 0.8 μm in thickness.

Figure 5I:
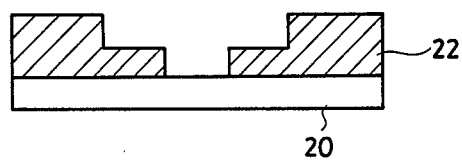

Finally, the polyimide portions 24a and 30a and the X-ray absorber 22a serving as an exposed plated electrode are removed, thereby to complete an X-ray mask for forming a T-shaped control electrode having a desired sectional configuration as shown in FIG. 5I.

Figure 6:
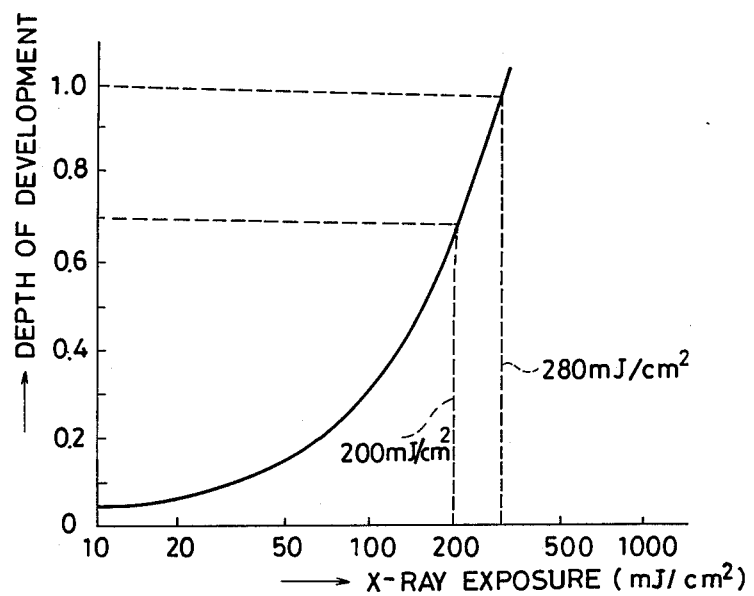
FIG. 6 illustrates relation between X-ray exposure on a positive resist film in a method of forming a T-shaped control electrode according to the present invention and depth of the development thereof, with the horizontal axis showing the X-ray exposure and the vertical axis showing the depth of development.

FIG. 6 illustrates relationship between X-ray exposure on a positive resist film and the depth of development.

Referring to FIG. 6, the horizontal axis shows the X-ray exposure and the vertical axis shows the depth of development. The data in FIG. 6 are obtained with respect to X-rays of PdLα rays, a positive resist film of RE-5000P (by Hitachi Kasei) and a developing solution of NMD-3 (by Tokyo Ohka). The process of development of a positive resist film is generally similar to the process of etching, and the speed of development depends on the exposure. Hence, the results are similar with respect to another type of positive resist film.

An embodiment of the inventive method of forming a T-shaped control electrode is carried out through the characteristics of the positive resist film and the aforementioned X-ray mask. This method is described hereinafter.

FIGS. 7A to 7E are sectional views showing principal steps of the method of forming a T-shaped control electrode according to the embodiment.

Figure 7A:
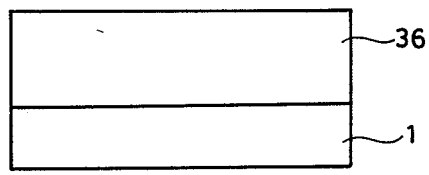
FIGS. 7A to 7E are sectional views showing principal steps in a method of forming a T-shaped control electrode on a semiconductor substrate by utilizing a specific X-ray mask according to an embodiment of the present invention.

As shown in FIG. 7A, an X-ray sensitive positive resist film 36 of RE-5000P of 1 μm in thickness, for example, is formed on a semiconductor substrate 1 of, e.g., gallium arsenide (GaAs).

Figure 7B:
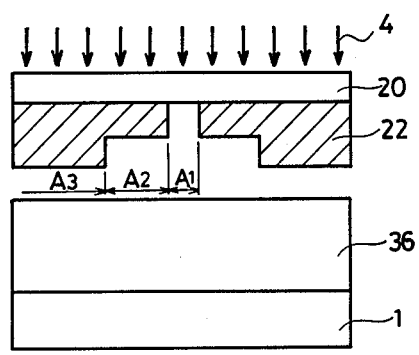

Then, as shown in FIG. 7B, the positive resist film 36 is irradiated with X-rays 4 through an X-ray mask formed by an X-ray absorber 22 having the aforementioned sectional configuration and an X-ray transmittable substrate 20. Assuming that exposure of X-rays passing through a portion $A_1$ is 300 mJ/cm², exposure values of the X-rays passing through portions $A_2$ ($T_1=0.2$ μm) and $A_3$ ($T_2=0.8$ μm) are 150 mJ/cm² and 20 mJ/cm² respectively through the relation of mask contrast.

Figure 7C:
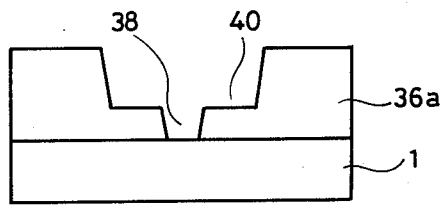

Then the substance is developed for 60 seconds by a developing solution (NMD-3), whereby a resist film 36a having a T-shaped opening section defined by openings 38 and 40 is formed as shown in FIG. 7C due to the difference in X-ray exposure as obvious from FIG. 6.

Figure 7D:
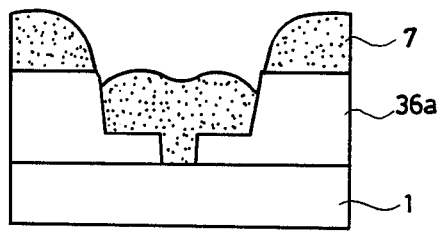

A T-shaped control electrode film 7 of Au or the like is formed thereafter on the resist film 36a through vacuum evaporation, as shown in FIG. 7D.

Figure 7E:
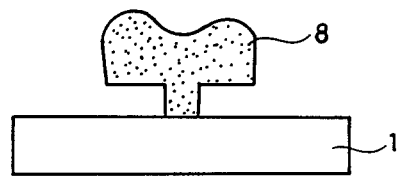

Finally, the semiconductor substrate 1 is dipped in a solution for the resist film 36a to remove the resist film 36a with the control electrode film 7 located on the resist film 36a, thereby to form a desired T-shaped control electrode 8 on the semiconductor substrate 1 as shown in FIG. 7E.

Although the Au film thickness of the X-ray mask for forming a T-shaped control electrode is limited in the aforementioned embodiment, the Au film thickness may be varied with the configuration of the T-shaped control electrode or the type of the positive resist film, while the Au film may be replaced by a film of heavy noble metal such as tantalum (Ta) or tungsten (W), which has a large X-ray absorber coefficient.

Further, although the positive resist film is prepared by RE-5000P and the developing solution is prepared by NMD-3 in the aforementioned embodiment, the same may be prepared by other products so far as the positive resist film is sensitive to X-rays and the developing solution can develop the positive resist film.

Although PdLα rays are employed in the X-ray exposure step of the aforementioned embodiment, the same may be replaced by AlKα rays or MoLα rays.

Although the T-shaped control electrode is prepared by Au in the aforementioned embodiment, the same may be prepared by other material.

Further, although the T-shaped control electrode is formed on the semiconductor substrate of GaAs in the above embodiment, the same may be formed on a semiconductor substrate of silicon (Si).

Another embodiment of the inventive method of forming a T-shaped control electrode will now be described.

Figure 8:
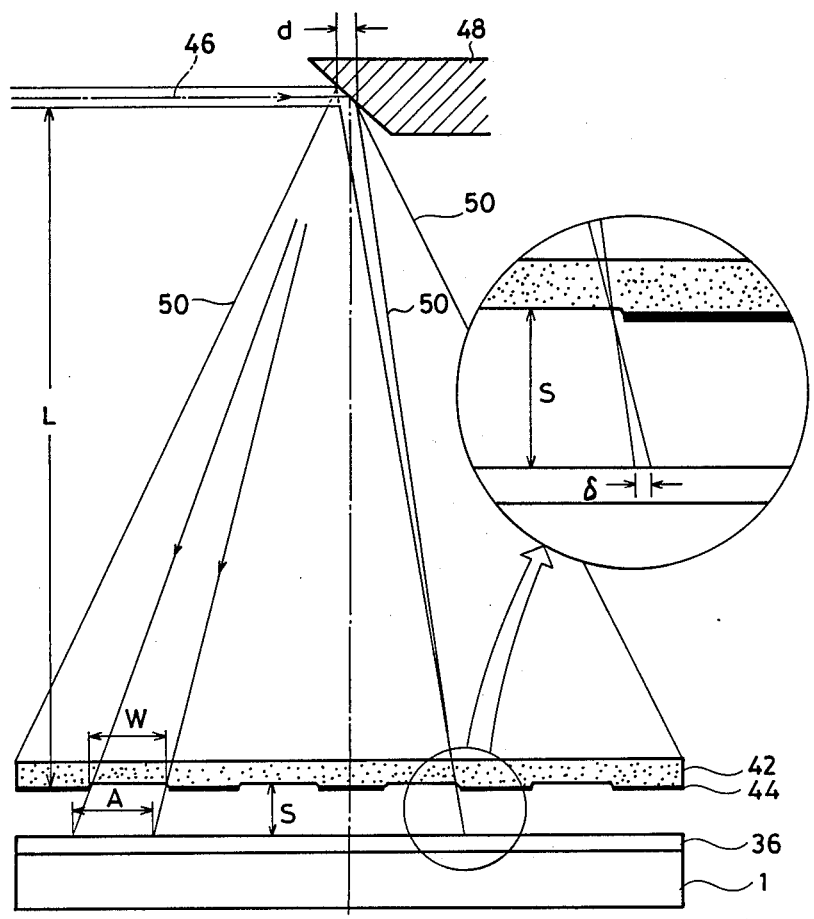
FIG. 8 illustrates an X-ray exposure principle in a method of forming a T-shaped control electrode according to another embodiment of the present invention, with a positional relation between an X-ray source, an X-ray mask and a positive resist film formed on a semiconductor substrate.
Figure 8A:
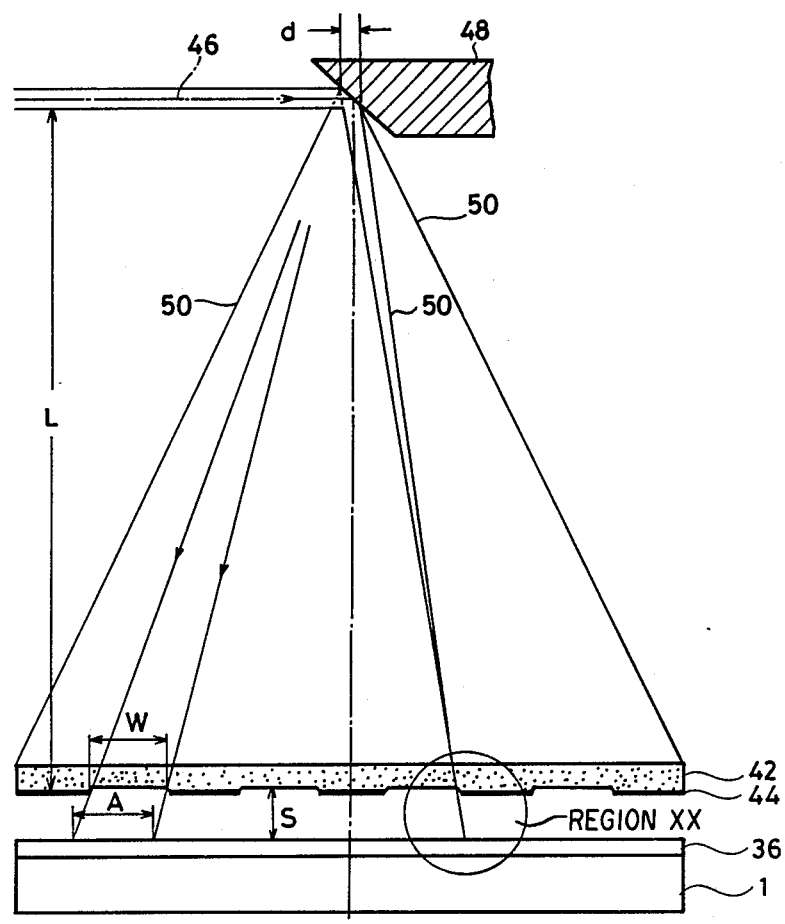
Figure 8B:
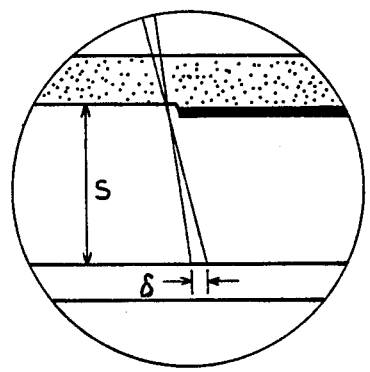

FIG. 8 illustrates an X-ray exposure principle of this embodiment.

Referring to FIG. 8, an X-ray mask formed by an X-ray absorber 44 and a support film 42 is provided above a semiconductor substrate 1 formed with a positive resist film 36, and a metal target 48 for emitting X-rays 50 through irradiation of electron beams 46 is provided above the X-ray mask. The X-rays 50 emitted from the metal target 48 are applied to the positive resist film 36 through the X-ray mask formed by the X-ray absorber 44 and the support film 42.

A description is now provided of the relationship of the distance between the X-ray mask and the semiconductor substrate and the area of irradiation.

First, consider the relation in a case where the X-rays are emitted from a point light source. Assuming that symbol L represents the distance between the X-ray source and the X-ray absorber 44, symbol S represents the distance between the X-ray absorber 44 and the positive resist film 36, symbol A represents the width of an exposed portion of the positive resist film 36 and symbol W represents opening width of the X-ray absorber 44, the following expression holds:

$$W/L = A/(L+S)$$

Thus, $$\begin{aligned} A &= W \times (L + S)/L \\ &= W \times (1 + S/L) \end{aligned} \quad (1)$$

It is obvious that L is decreased, S is increased and W remains constant as the X-ray mask approaches the X-ray source, and hence the width A, i.e., the exposure area, is increased.

Then, consider the range of shadow graduation through the effect of the X-ray source having a given size (diameter d) in practice. Assuming that S and L are identical to the above and δ represents the width of shadow graduation, the following expression holds:

$$S/\delta = L/D$$

Thus, $$\delta = S \times d/L \quad (2)$$

It is obvious that L is decreased, S is increased and d remains constant as the X-ray mask approaches the X-ray source, and hence the width δ, i.e., the exposure area by shadow graduation is increased.

With the results of the expressions (1) and (2), the exposure area on the positive resist film 36 can be adjusted in response to the distance between the X-ray mask and the irradiated substance.

FIGS. 9A to 9E are sectional views showing principal steps in still another embodiment of the inventive method of forming a T-shaped control electrode employing the X-ray exposure principle.

Figure 9A:
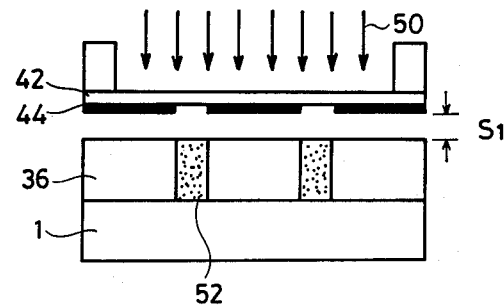
FIGS. 9A to 9E are sectional views showing principal steps in a method of forming a T-shaped control electrode according to still another embodiment of the present invention by performing exposure steps twice while changing the distance between an X-ray mask and a positive resist film.

As shown in FIG. 9A, a positive resist film 36 of RE-5000P is rotatingly coated on a semiconductor substrate 1 in thickness of 1.0 μm and baked at 90° C. for 10 minutes, and then irradiated with X-rays 50 of PdLα rays through an X-ray mask formed by an X-ray absorber 44 of gold (Au) and a support film 42 of boron nitride (BN) for a constant period. The distance $S_1$ between the X-ray absorber 44 and the positive resist film 36 is 5 μm (width of shadow graduation is 0.05 μm) and the exposure is 80 mJ/cm².

Figure 9B:
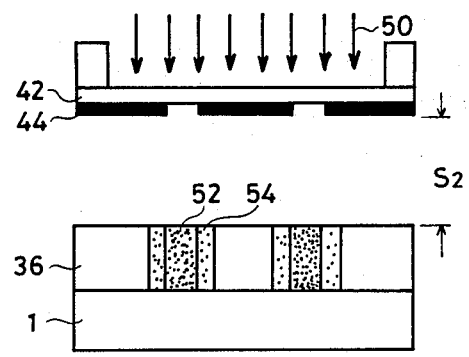

Then, the distance between the X-ray absorber 44 and the positive resist film 36 is changed to $S_2 = 30$ μm (width of shadow graduation is 0.3 μm) as shown in FIG. 9B to be subjected to exposure of 200 mJ/cm², so that the exposure area is expanded from an exposed portion 52 to an expanded exposed portion 54, as hereinabove described.

The exposure on the exposed portion 52 is increased to 80+200=280 mJ/cm² through the two exposure steps, while the exposure on the expanded exposed portion 54 is 200 mJ/cm² through the second exposure step.

Figure 9C:
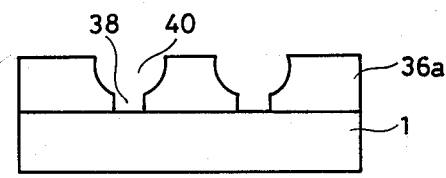

Referring again to FIG. 6, the depth of development with the exposure of 280 mJ/cm² is 1.0 μm to reach the semiconductor substrate 1, while the depth of development with the exposure of 200 mJ/cm² is 0.7 μm, not to reach the semiconductor substrate 1. Thus, after the two exposure steps with irradiation of the X-rays 50, the positive resist film 36 is developed by a developing solution (NMD-3) for 60 seconds and rinsed by demineralized water, so that a resist film 36a having a T-shaped sectional configuration defined by openings 38 and 40 is formed as shown in FIG. 9C due to the difference in exposure of the positive resist film 36.

Figure 9D:
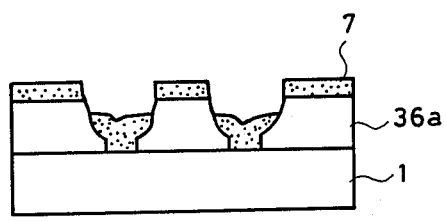

Then, as shown in FIG. 9D, a control electrode film 7 is formed in a thickness of 0.5 μm on the semiconductor substrate 1 and the resist film 36a.

Figure 9E:
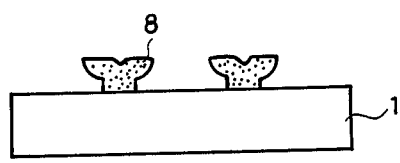

Finally, the resist film 36a is removed with the control electrode film 7 located on the same, whereby a T-shaped control electrode 8 is formed on the semiconductor substrate 1 as shown in FIG. 9E.

Although X-ray irradiation is performed twice in the aforementioned embodiment with a short distance between the X-ray absorber 44 and the positive resist film 36 and then with a long distance between the same, the sequence of irradiation is not restricted to the above.

Although PdLα rays are employed as the X-rays in the aforementioned embodiment, other characteristic X-rays of Si, W, Mo, Al, Cu etc. may be employed to attain a similar effect.

Further, although soft X-rays of PdLα rays are employed in the aforementioned embodiment, hard X-rays may be employed to attain a similar effect, so far as the positive resist film is sensitive to the same.

Although the aforementioned embodiments of the present invention are applied to the formation of a T-shaped control electrode, it is needless to say that the present invention is also applicable more widely, e.g., to formation of an interconnection pattern which must be T-shaped in section.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A method of forming a T-shaped control electrode having a section of a T shape by utilizing an X-ray mask, said method comprising the steps of:

preparing a semiconductor substrate having a major surface;

forming a positive resist film on said major surface of said semiconductor substrate;

irradiating said positive resist film with X-rays through said X-ray mask, thereby to form respectively a first irradiated region corresponding to the width of a first portion of said T shape and obtaining a first intensity of exposure thereat and a second irradiated region corresponding to the width of a second portion of said T shape and obtaining a second intensity of exposure thereat on said positive resist film through said irradiation;

developing said positive resist film irradiated with said X-rays to remove portions of said first and second irradiated regions, thereby to obtain a resist film having a sectional configuration corresponding to said T-shape;

forming a film for providing a control electrode on a portion of said resist film having said sectional configuration; and removing said resist film.

2. A method of forming a T-shaped control electrode in accordance with claim 1, wherein:

a first depth of development of said positive resist film based on said first exposure is at least equal to a film thickness of said positive resist film.

3. A method of forming a T-shaped control electrode in accordance with claim 2, wherein:

a second depth of development of said positive resist film based on said second exposure is at least smaller than said film thickness of said positive resist film.

4. A method of forming a T-shaped control electrode having a section of a T shape by utilizing an X-ray mask, said method comprising:

a step of preparing a semiconductor substrate having a major surface;

a step of forming a positive resist film on said major surface of said semiconductor substrate;

a step of irradiating said positive resist film with X-rays through said X-ray mask formed by a joined member of a substrate for transmitting X-rays and an absorber for absorbing X-rays, said absorber having an opening section being in contact with said substrate and corresponding to said T shape thereby to change the amount of transmission of X-rays in desired positions;

a step of developing said positive resist film irradiated with said X-rays to obtain a resist film having a desired sectional configuration;

a step of forming a film for providing a control electrode in a portion of said resist film having said sectional configuration; and a step of removing said resist film.

5. A method of forming a T-shaped control electrode in accordance with claim 4, wherein:

said substrate comprises silicon nitride (SiN).

6. A method of forming a T-shaped control electrode in accordance with claim 5 wherein:

said absorber comprises a metal having a large x-ray absorption coefficient, selected from a group of metals including gold, tungsten and tantalum.

7. A method of forming a T-shaped control electrode with claim 4, wherein:

said film comprises gold (Au).

8. A method of forming a T-shaped control electrode having a section of a T shape by employing an X-ray mask, said method comprising:

a step of preparing a semiconductor substrate having a major surface, a step of forming a positive resist film on said major surface of said semiconductor substrate;

a step of irradiating said positive resist film with divergent X-rays through said X-ray mask located at a first distance from said semiconductor substrate;

a step of irradiating said positive resist film with said X-rays through said X-ray mask located at a second distance, that is selected to be different from said first distance, from said semiconductor substrate;

a step of developing said positive resist film irradiated with said X-rays to obtain a resist film having a desired sectional configuration responsive to exposure;

a step of forming a film for providing a control electrode in a portion of said resist film having said sectional configuration; and a step of removing said resist film.

9. A method of forming a T-shaped control electrode in accordance with claim 8, wherein:

said first distance is larger than said second distance.

10. A method of forming a T-shaped control electrode in accordance with claim 8, wherein:

said second distance is larger than said first distance.

11. A method of forming a T-shaped control electrode in accordance with claim 8, wherein:

said X-rays are characteristic X-rays.

12. A method of forming a T-shaped control electrode in accordance with claim 8, wherein:

said X-rays are soft X-rays.

* * * * *